United States Patent

Nakamura et al.

[11] Patent Number: 5,861,361
[45] Date of Patent: *Jan. 19, 1999

[54] SUPERCONDUCTING FIELD EFFECT DEVICE HAVING A SUPERCONDUCTING CHANNEL AND METHOD FOR MANUFACTURING THE SAME

[75] Inventors: Takao Nakamura; Michitomo Iiyama, both of Osaka, Japan

[73] Assignee: Sumitomo Electric Industries, Ltd., Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 633,444

[22] Filed: Apr. 17, 1996

[30] Foreign Application Priority Data

Apr. 17, 1995 [JP] Japan .................................. 7-115070

[51] Int. Cl.$^6$ .................................................. H01L 39/22
[52] U.S. Cl. .......................... 505/193; 505/234; 505/235; 505/237; 505/238; 505/701; 505/702; 257/36; 257/39; 428/210; 428/697; 428/699; 428/701; 428/702; 428/930
[58] Field of Search .................................. 257/36, 37, 38, 257/39; 505/126, 193, 234, 235, 236, 237, 238, 239, 701, 702; 428/209, 210, 697, 699, 701, 702, 930

[56] References Cited

U.S. PATENT DOCUMENTS

| | | | |
|---|---|---|---|
| 5,418,389 | 5/1995 | Watanabe | 257/295 |
| 5,422,336 | 6/1995 | Tsuda et al. | 505/193 |
| 5,422,338 | 6/1995 | Watanabe | 505/329 |
| 5,441,926 | 8/1995 | Kimura et al. | 505/193 |
| 5,521,862 | 5/1996 | Frazier | 365/160 |

FOREIGN PATENT DOCUMENTS

| | | |
|---|---|---|
| 0 309 313 | 3/1989 | European Pat. Off. . |
| 0 315 977 | 5/1989 | European Pat. Off. . |
| 0 533 519 | 3/1993 | European Pat. Off. . |

*Primary Examiner*—Marie Yamnitzky
*Attorney, Agent, or Firm*—Foley & Lardner

[57] ABSTRACT

A FET type superconducting device comprises a thin superconducting channel, a superconducting source region and a superconducting drain region formed of an oxide superconductor over a principal surface of the substrate, and a gate electrode on a gate insulator disposed on the superconducting channel for controlling the superconducting current flowing through the superconducting channel by a signal voltage applied to the gate electrode. The superconducting channel is formed of $(Pr_w Y_{1-w})Ba_2Cu_3O_{7-z}$ (0<w<1, 0<z<1) oxide superconductor or $Y_1Ba_2Cu_{3-v}CO_vO_{7-u}$ (0<v<3, 0<u<1) oxide superconductor.

These oxide superconductors have smaller carrier densities than the conventional oxide superconductor so that the superconducting channel has a larger thickness than the one funned of the conventional oxide superconductor.

7 Claims, 3 Drawing Sheets

SUPERCONDUCTING FIELD EFFECT DEVICE HAVING A SUPERCONDUCTING CHANNEL AND METHOD FOR MANUFACTURING THE SAME

BACKGROUND OF THE INVENTION

1. Field of the Invention

The present invention relates to a superconducting field effect device and method for manufacturing it. More specifically the present invention relates to a field effect transistor type superconducting device comprising a superconducting channel of oxide superconductor which has a larger thickness than the conventional one.

2. Description of Related Art

Devices which utilize superconducting phenomena operate rapidly with low power consumption so that they have higher performance than conventional semiconductor devices. Particularly, by using an oxide superconductor material which has been recently advanced in study, it is possible to produce a superconducting device which operates at relatively high temperature.

One of the most important three-terminal superconducting devices is a field effect transistor type superconducting device (abbreviated as super-FET hereinafter) having a channel of a superconductor formed between a source and a drain. In this superconducting device, a current flowing through the superconducting channel is controlled by a signal voltage applied to a gate formed above the superconducting channel.

The super-FET mentioned above is a voltage controlled device which is capable of isolating output signals from input ones and of having a well defined gain. In addition, it has a large current capability.

Referring to FIG. 1, a typical super-FET utilizing an oxide superconductor will be explained. FIG. 1 shows a sectional view of a super-FET which is similar to the one described in the published European Patent Application No. EP-A-0 533 519.

The super-FET shown in FIG. 1 comprises a substrate 5 of, for example, $SrTiO_3$, a buffer layer 20 of an oxide, for example, $Pr_1Ba_2Cu_3O_{7-y}$, disposed on the substrate 5, a superconducting channel 10 of an oxide superconductor, for example, $Y_1Ba_2Cu_3O_{7-x}$ disposed on the buffer layer 20, a superconducting source region 2 and a superconducting drain region 3 of $Y_1Ba_2Cu_3O_{7-x}$ disposed at each end of the superconducting channel 10. The super-FET further comprises a gate electrode 4 on a gate insulator 7 disposed on the superconducting channel 10, a source electrode 12 and a drain electrode 13 disposed each on the superconducting source region 2 and superconducting drain region 3.

The superconducting source region 2 and superconducting drain region 3 can be formed of an oxide superconductor different from that of the superconducting channel 10. The gate electrode 4, source electrode 12 and drain electrode 13 can be formed of a noble metal such as Au.

In the super-FET, superconducting current flowing through the superconducting channel 10 is controlled by a signal voltage applied to the gate electrode 4. The $Y_1Ba_2Cu_3O_{7-x}$ oxide superconductor has a carrier density of $10^{20}$–$10^{21}/cm^3$, so that both of the superconducting channel and the gate insulator should have an extremely thin thickness to obtain a complete ON/OFF operation by a signal voltage of a few volts, which is usually used for CMOS semiconductor devices, applied to the gate electrode 4. For example, the superconducting channel should have a thickness of five nanometers or less and the gate insulating layer should have a thickness of ten to fifteen nanometers or more to prevent a tunnel current, but it should be as thin as possible.

For excellent properties of the super-FET, the thin superconducting channel should be formed of an oxide superconductor Slim having good characteristics and high crystallinity without any grain boundary which may form an unnecessary Josephson junction. In order to) realize this thin superconducting channel, the above super-FET comprises a buffer layer 20 of $Pr_1Ba_2Cu_3O_{7-y}$ oxide having a crystal structure equal to that of $Y_1Ba_2Cu_3O_{7-x}$ oxide superconductor and lattice parameters similar to those of $Y_1Ba_2Cu_3O_{7-x}$ oxide superconductor is formed on the substrate 5 and the oxide superconductor film of the superconducting channel 10 is deposited on the buffer layer 20.

The buffer layer prevents interdiffusion between the substrate and the superconducting channel and cancels inconsistencies of lattice parameters. Therefore, an oxide superconductor film well grows second dimensionally on the buffer layer.

However, the super-FET has such a fine gate structure, as mentioned above, which requires detailed processing steps that are difficult to conduct. Due to the difficult processing steps, the steps for manufacturing the super-FET increases and fabrication yield decreases.

SUMMARY OF THE INVENTION

Accordingly, it is an object of the present invention to provide a novel super-FET having a superconducting channel of a thicker oxide superconductor film, which have overcome the above mentioned defects of the conventional ones.

Another object of the present invention to provide a method for manufacturing the above novel super-FET.

The above and other objects of the present invention are achieved in accordance with the present invention by a superconducting device; comprising:

a substrate having a principal surface;

a thin superconducting channel formed of an oxide superconductor over the principal surface of the substrate;

a superconducting source region and a superconducting drain region formed of an oxide superconductor over the principal surface of the substrate at the both ends of the superconducting channel which connects the superconducting source region and the superconducting drain region, so that superconducting current can flow through the superconducting channel between the superconducting source region and the superconducting drain region; and a gate electrode on a gate insulator disposed on the superconducting channel for controlling the superconducting current flowing through the superconducting channel by a signal voltage applied to the gate electrode; wherein the superconducting channel comprises $(Pr_wY_{1-w})Ba_2Cu_3O_{7-z}$ (0<w<1, 0<z<1) oxide superconductor or $Y_1Ba_2Cu_{3-v}Co_vO_{7-u}$ (0<v<3, 0<u<1) oxide superconductor.

These oxide superconductors have smaller carrier densities than the conventional oxide superconductor so that the superconducting channel has a larger thickness than the one formed of the conventional oxide superconductor In one preferred embodiment, the superconducting channel has a thickness of 10 to 30 nanometers. This larger thickness of the superconducting channel relaxes the required conditions of the fine processing to form the super-FET, in particular, to form the superconducting channel.

According to one embodiment of the present invention, the superconducting channel is formed of a $(Pr_w Y_{1-w})Ba_2Cu_3O_{7-z}$ ($0<w<1$, $0<z<1$) gradient composition oxide superconductor film in which w continuously decreases from the bottom to the top. Namely, the lower portion of the superconducting channel has the larger praseodymium content. The less praseodymium content of the upper portion of the superconducting channel contributes large current capability even if the current capability of the bottom portion of the superconducting channel is degraded by the high praseodymium.

According to one embodiment of the present invention, the superconducting channel is formed of a $Y_1Ba_2Cu_{3-v}Co_vO_{7-u}$ ($0<v<3$, $0<u<1$) gradient composition oxide superconductor film in which v continuously decreases from the bottom to the top. Namely, the lower portion of the superconducting channel has the larger cobalt content. The less cobalt content of the upper portion of the superconducting channel contributed large current capability even if the current capability of the bottom portion of the superconducting channel is degraded by the high cobalt content.

In the superconducting device in accordance with the present invention, a buffer layer of a non-superconducting oxide is preferably disposed between the active parts of the super-FET, in particular, the superconducting channel and the principal surface of the substrate. The non-superconducting oxide layer preferably has a similar crystal structure to that of an oxide superconductor. The buffer layer prevents mutual diffusion between the oxide superconductors of the super-FET and the substrate so that the oxide superconductors have high crystallinity and excellent superconducting properties. For this purpose, the buffer layer preferably has a thickness of 10 to 30 nanometers.

Preferably, the above buffer layer is formed of a $Pr_1Ba_2Cu_3O_{7-y}$ oxide. $Pr_1Ba_2Cu_3O_{7-y}$ has almost the same crystal lattice structure as that of an oxide superconductor.

In a preferred embodiment, the superconducting source region and superconducting drain region are formed of high-$T_c$ (high critical temperature) oxide superconductor, particularly, formed of a high-$T_c$ copper-oxide type compound oxide superconductor for example a Y—Ba—Cu—O compound oxide superconductor material, a Bi—Sr—Ca—Cu—O compound oxide superconductor material, and a Tl—Ba—Ca—Cu—O compound oxide superconductor material.

In addition, the substrate can be formed of an insulating substrate, preferably an oxide single crystalline substrate such as MgO, $SrTiO_3$, YSZ, etc. These substrate materials are very effective in forming or growing a crystalline film having a well defined crystalline orientation.

However, in one preferred embodiment, the super-FET can be formed on a substrate of a semiconductor material, if an appropriate insulating buffer layer is deposited thereon. For example, the buffer layer on the semiconductor substrate can be formed of a double-layer coating formed of a $MgAl_2O_4$ layer and a $BaTiO_3$ layer if silicon is used as a substrate.

The above and other objects, features and advantages of the present invention will be apparent from the following description of preferred embodiments of the invention with reference to the accompanying drawings.

DESCRIPTION OF THE PREFERRED EMBODIMENTS

Embodiment 1

Referring to FIGS. 2A to 2F, a process for manufacturing the super-FET in accordance with the present invention will be described.

Figure 1:
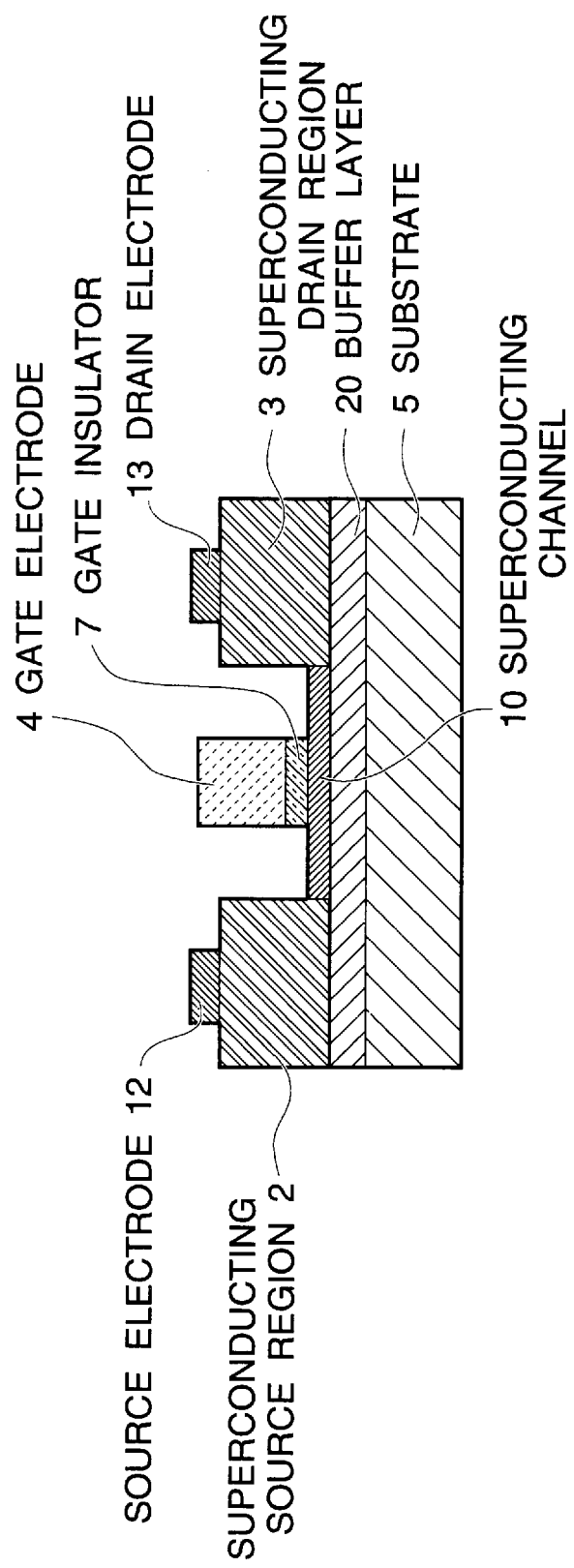
FIG. 1 is a diagrammatic sectional view of a typical super-FET.
Figure 2A:
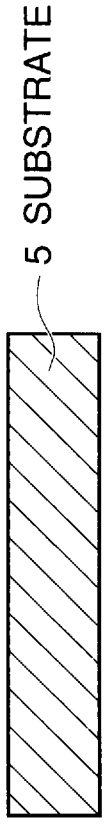
FIGS. 2A to 2F are diagrammatic sectional views for illustrating an embodiment of the process for manufacturing the super-FET in accordance with the present invention.
Figure 2B:
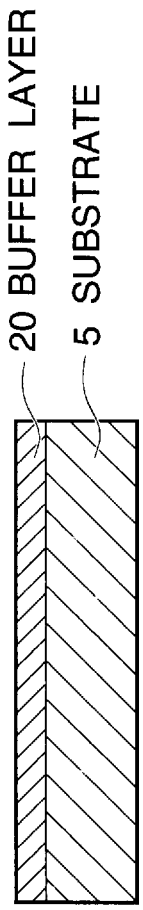

On a $SrTiO_3$ (100) single crystalline substrate 5 as shown in FIG. 2A, a c-axis orientated $Pr_1Ba_2Cu_3O_{7-y}$ oxide buffer layer 20 was deposited by a reactive co-evaporation, as shown in FIG. 2B. The c-axis orientated $Pr_1Ba_2Cu_3O_{7-y}$ oxide buffer layer 20 was formed of a $Pr_1Ba_2Cu_3O_{7-y}$ oxide crystal having c-axes perpendicular to the substrate. The $Pr_1Ba_2Cu_3O_{7-y}$ oxide buffer layer 20 may also be prepared by an MBE (Molecular Beam Epitaxy). A condition of forming the $Pr_1Ba_2Cu_3O_{7-y}$ oxide buffer layer 20 by a reactive co-evaporation is as follows:

Substrate temperature 700 ° C.

Pressure $3.999 \times 10^{-3}$ Pa ($3 \times 10^{-5}$ Torr) (near the substrate; $O_2$ including 70 vol.% $O_3$ or more)

Evaporation source Pr: 1300 ° C. and its crucible temperature Ba: 620 ° C. Cu: 1000° C.

Film thickness 10 nanometers

The $Pr_1Ba_2Cu_3O_{7-y}$ buffer layer 20 preferably has a thickness of 10 to 30 nanometers, on which an oxide superconductor layer of high crystallinity and excellent superconducting properties can be deposited.

Figure 2C:
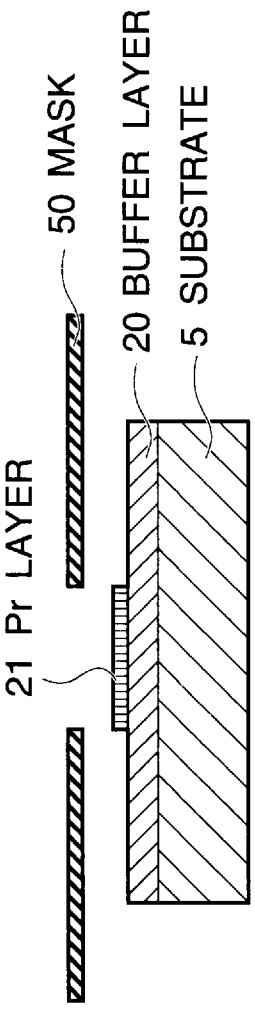

Then, only a praseodymium evaporation source was opened and the other evaporation sources were closed so that a praseodymium layer 21 was deposited on a center portion of the $Pr_1Ba_2Cu_3O_{7-y}$ buffer layer 20, as shown in FIG. 2C. A condition of forming the praseodymium layer 21 is as follows:

Substrate temperature 500° C.

Pressure $1.333 \times 10^{-7}$ Pa ($1 \times 10^{-9}$ Torr)

Film thickness 10 nanometers

Figure 2D:
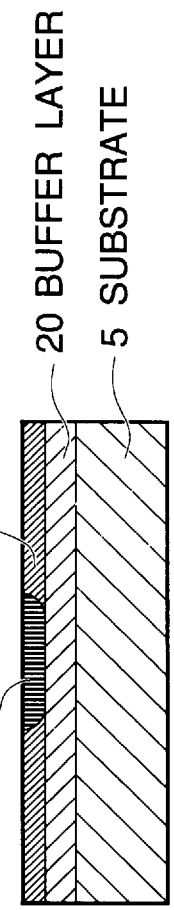

Thereafter, switching evaporation sources to yttriunm, barium and copper, a $Y_1Ba_2Cu_3O_{7-x}$ oxide superconductor film 1 was deposited over the $Pr_1Ba_2Cu_3O_{7-y}$ buffer layer 20 by a reactive co-evaporation, as shown in FIG. 2D. While the $Y_1Ba_2Cu_3O_{7-x}$ oxide superconductor film was grown, the praseodymium diffused to form a region 22 of $(Pr_w Y_{1-w})Ba_2Cu_3O_{7-z}$ ($0<w<1$, $0<z<1$) oxide superconductor in the $Y_1Ba_2Cu_3O_{7-x}$ oxide superconductor film 1. In the region 22, the $(Pr_w Y_{1-w})Ba_2Cu_3O_{7-z}$ oxide superconductor had a gradient composition in which w gradually decreased from the bottom of the region 22 to the top of the region 22. Namely, the lower portion of the region 22 had the larger praseodymium content. The top of the region 22 was formed of $Pr_{0.2}Y_{0.8}Ba_2Cu_3O_{7-z}$ oxide superconductor and its bottom was formed of $Pr_1Ba_2Cu_3O_{7-y}$ oxide. The less praseodymium content of the upper portion of the superconducting channel contributed large current capability even if the current capability of the bottom portion of the superconducting channel was degraded by the high praseodymium.

For this purpose, the top of the region 22 should be formed of $(Pr_w Y_{1-w})Ba_2Cu_3O_{7-z}$ oxide superconductor in which w is less than 0.5. The $(Pr_w Y_{1-w})Ba_2Cu_3O_{7-z}$ oxide superconductor will lose its superconductivity when w is 0.5 or more.

The $Y_1Ba_2Cu_3O_{7-x}$ oxide superconductor film 1 was grown so as to have a thickness of about 20 nanometers which was suitable for a superconducting channel of a super-FET formed of $(Pr_w Y_{1-w})Ba_2Cu_3O_{7-z}$ oxide superconductor. A portion of $(Pr_w Y_{1-w})Ba_2Cu_3O_{7-z}$ oxide superconductor in which w is less than 0.5 had a thickness of about 15 nanometers from the top of the region 22. The superconducting channel of $(Pr_w Y_{1-w})Ba_2Cu_3O_{7-z}$ oxide superconductor preferably has a thickness of 10 to 30 nanometers. In addition, it is preferable that the region 22 has a portion of $(Pr_w Y_{1-w})Ba_2Cu_3O_{7-z}$ oxide superconductor in which w is less than 0.5, which has at least a half thickness of the region 22 from the top of the region 22. A condition of forming the $Y_1Ba_2Cu_3O_{7-x}$ oxide superconductor film 1 by a reactive co-evaporation is as follows:

Substrate temperature 700° C.

Pressure $3.999 \times 10^{-3}$ Pa ($3 \times 10^{-5}$ Torr) (near the substrate; $O_2$ including 70 vol. % $O_3$ or more)

Evaporation source Y: 1220 ° C. and its crucible temperature Ba: 620 ° C. Cu: 1000° C.

Film thickness 20 nanometers

Figure 2E:
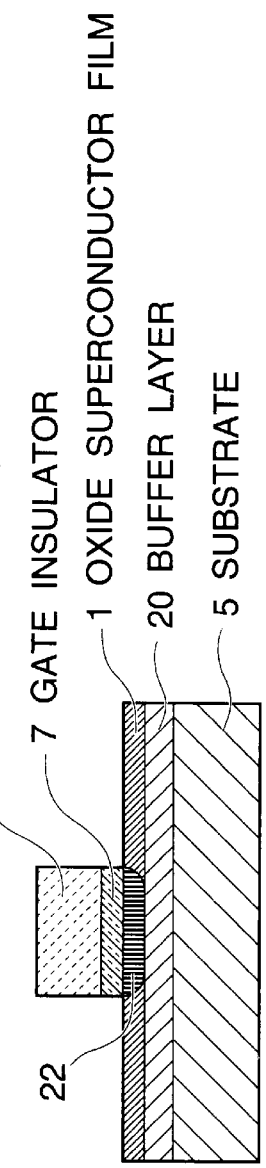

Then, as shown in FIG. 2E, a gate insulator 7 of $SrTiO_3$ was formed on the region 22 of the $Y_1Ba_2Cu_3O_{7-x}$ oxide superconductor film 1 by a reactive co-evaporation and a gate electrode 4 was formed of Au on the gate insulator 7 by a vacuum evaporation. The gate insulator 7 should have a thickness of 10 nanometers or more so as to prevent tunnel current. However, if the gate insulator 7 has a too large thickness, higher signal voltages are required to modulate and control superconducting current flowing through the superconducting channel. Therefore, the gate insulating layer 7 should have a thickness of 100 nanometers or less. A condition of forming the $SrTiO_3$ gate insulating layer 7 by a reactive co-evaporation is as follows:

Substrate temperature 500° C.

Pressure $3.999 \times 10^{-3}$ Pa ($3 \times 10^{-5}$ Torr) (near the substrate; $O_2$ including 70 vol. % $O_3$ or more)

Evaporation source Sr: 600 ° C. and its crucible temperature Ti: 1500 ° C.

Film thickness 15 nanometers

The gate insulating layer 7 can be formed of MgO, $Si_3N_4$ or $Ba_xSr_{1-x}TiO_3$ ($0 \leq x \leq 1$). The gate electrode 4 can also be formed of a noble metal such as Pt, Ag, polycrystalline silicon or an oxide superconductor.

Figure 2F:
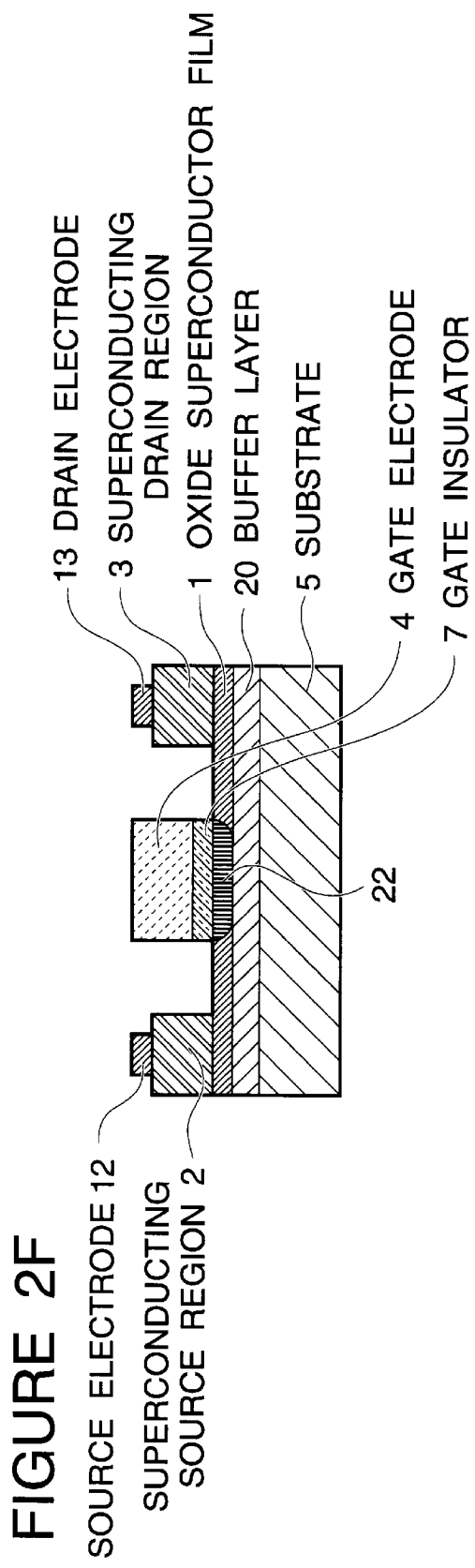

Finally, as shown in FIG. 2F, an oxide superconductor film was deposited on portions of the $Y_1Ba_2Cu_3O_{7-x}$ oxide superconductor film 1 at the both sides of the gate electrode 4 by a reactive evaporation so as to form a superconducting source region 2 and superconducting drain region 3. In the above super-FET, the region 22 of the $Y_1Ba_2Cu_3O_{7-x}$ oxide superconductor film I just under the gate electrode 4 formed a superconducting channel.

The superconducting source region 2 and superconducting drain region 3 preferably have a thickness of 100 nanometers or more which is sufficient to form contacts on them. In addition, since the superconducting channel is connected to lower portions of the superconducting source region 2 and superconducting drain region 3, it is preferable to form them of an a-axis orientated $Y_1Ba_2Cu_3O_{7-x}$ oxide superconductor film through which large superconducting current can flow in a direction perpendicular to the film surface.

A condition of forming an a-axis orientated $Y_1Ba_2Cu_3O_{7-x}$ oxide superconductor film for the superconducting source region 2 and superconducting drain region 3 by a reactive co-evaporation is as follows:

Substrate temperature 650 ° C.

Pressure $3.999 \times 10^{-3}$ Pa ($3 \times 10^{-5}$ Torr) (near the substrate; $O_2$ including 70 vol. % $O_3$ or more)

Evaporation source Y: 1220 ° C. and its crucible temperature Ba: 620 ° C. Cu: 1000 ° C.

Film thickness 300 nanometers

A metal source electrode 12 and drain electrode 13 of Au were formed on each of the superconducting source region 2 and superconducting drain region 3. With this, the super-FET in accordance with the present invention is completed.

Properties of the super-FET in accordance with the present invention manufactured as mentioned above were measured. It became clear that the super-FET in accordance with the present invention had ideal current-voltage characteristics between the superconducting source and drain region.

In this embodiment, only one super-FET according to the present invention has been described. However, the present invention is not limited to this embodiment. For example, the superconducting source region and the superconducting drain region may be gently connected to the superconducting channel so that superconducting current efficiently flows from the superconducting source region into the extremely thin superconducting channel and efficiently flows from the extremely thin superconducting channel to the superconducting drain region. In addition, the superconducting channel, the gate insulating layer and the gate electrode may have configurations so that they are self-aligned in the manufacturing process.

Embodiment 2

A process for manufacturing the super-FET of different type in accordance with the present invention will be described. The super-FET of this embodiment had a superconducting channel formed of $Y_1Ba_2Cu_{3-v}Co_vO_{7-u}$ ($0<v<3$, $0<u<1$) oxide superconductor. The other parts of the super-FET were the same as those of the super-FET of Embodiment 1. Therefore, the differences will be mainly described hereinafter.

On a $SrTiO_3$ (100) single crystalline substrate 5 as shown in FIG. 2A, a c-axis orientated $Pr_1Ba_2Cu_3O_{7-y}$ oxide buffer layer 20 having a thickness of 10 nanometers is deposited by a reactive co-evaporation, as shown in FIG. 2B under a condition the same as Embodiment 1.

Then, a cobalt layer 21 was deposited on a center portion of the $Pr_1Ba_2Cu_3O_{7-y}$ buffer layer 20, as shown in FIG. 2C. A condition of forming the cobalt layer 21 by an evaporation is as follows:

Substrate temperature 700° C.

Pressure $1.333 \times 10^{-7}$ Pa ($1 \times 10^{-9}$ Torr)

Film thickness 10 nanometers

Thereafter, a $Y_1Ba_2Cu_3O_{7-x}$ oxide superconductor film 1 was deposited over the $Pr_1Ba_2Cu_3O_{7-y}$ buffer layer 20 by a reactive co-evaporation, as shown in FIG. 2D. While the $Y_1Ba_2Cu_3O_{7-x}$ oxide superconductor film was grown, cobalt diffused to form a region 22 of $Y_1Ba_2Cu_{3-v}Co_vO_{7-u}$ ($0<v<3$, $0<u<1$) oxide superconductor in the $Y_1Ba_2Cu_3O_{7-x}$ oxide superconductor film 1. In the region 22, the $Y_1Ba_2Cu_{3-v}Co_vO_{7-u}$ oxide superconductor had a gradient composition in which v gradually decreased from the bottom of the region 22 to the top of the region 22. Namely, the lower portion of the region 22 had the larger cobalt content. The top of the region 22 was formed of $Y_1Ba_2Cu_{2.8}Co_{0.2}O_{7-u}$ oxide superconductor and its bottom was formed of a non-superconducting $Y_1Ba_2Cu_{2.5}Co_{0.5}O_{7-u}$ oxide. The less cobalt content of the upper portion of the superconducting channel contributed large current capability even if the current capability of the bottom portion of the superconducting channel was degraded by the high cobalt content.

For this purpose, the top of the region 22 should be formed of $Y_1Ba_2Cu_{3-v}Co_vO_{7-u}$ oxide superconductor in which v is less than 0.5. The $Y_1Ba_2Cu_{3-v}Co_vO_{7-u}$ oxide superconductor will lose its superconductivity when v is 0.5 or more.

The $Y_1Ba_2Cu_3O_{7-x}$ oxide superconductor film 1 was grown so as to have a thickness of about 20 nanometers which was suitable for a superconducting channel of a super-FET formed of $Y_1Ba_2Cu_{3-v}Co_vO_{7-u}$ oxide superconductor. A portion of $Y_1Ba_2Cu_{3-v}Co_vO_{7-u}$ oxide superconductor in which v is less than 0.5 had a thickness of about 15 nanometers from the top of the region 22. The superconducting channel of $Y_1Ba_2Cu_{3-v}Co_vO_{7-u}$ oxide superconductor preferably has a thickness of 10 to 30 nanometers. In addition, it is preferable that the region 22 has a portion of $Y_1Ba_2Cu_{3-v}Co_vO_{7-u}$ oxide superconductor in which v is less than 0.5, which at least a half thickness of the region 22 from the top of the region 22. The following steps were identical with the Embodiment 1.

Properties of the super-FET of this embodiment manufactured as mentioned above were measured. It became clear that the super-FETs of this embodiment had ideal current-voltage characteristics between the superconducting source and drain region.

In this embodiment, only one super-FET according to the present invention has been described. However, the present invention is not limited to this embodiment. For example, the superconducting source region and the superconducting drain region may be gently connected to the superconducting channel so that superconducting current efficiently flows from the superconducting source region into the extremely thin superconducting channel and efficiently flows from the extremely thin superconducting channel to the superconducting drain region. In addition, the superconducting channel, the gate insulating layer and the gate electrode may have configurations so that they are self-aligned in the manufacturing process.

In the above mentioned embodiments, the oxide superconductor film can be formed of not only the Y—Ba—Cu—O compound oxide superconductor material, but also a high-$T_c$ (high critical temperature) oxide superconductor material, particularly a high-$T_c$ copper-oxide type compound oxide superconductor material, for example a Bi—Sr—Ca—Cu—O compound oxide superconductor material, and a Tl—Ba—Ca—Cu—O compound oxide superconductor material.

The invention has thus been shown and described with reference to the specific embodiments. However, it should be noted that the present invention is in no way limited to the details of the illustrated structures but converts and modifications may be made within the scope of the appended claims.

We claim:

1. A superconducting device, comprising:

a substrate having a principal surface;

a superconducting channel formed of an oxide superconductor over the principal surface of the substrate;

a superconducting source region and a superconducting drain region formed of an oxide superconductor over the principal surface of the substrate at both ends of the superconducting channel which connects the superconducting source region and the superconducting drain region, so that superconducting current can flow through the superconducting channel between the superconducting source region and the superconducting drain region; and a gate electrode on a gate insulator disposed on the superconducting channel for controlling the superconducting current flowing through the superconducting channel by a signal voltage applied to the gate electrode;

wherein the superconducting channel comprises $(Pr_wY_{1-w})Ba_2Cu_3O_{7-z}$ (0<w<0.5, 0<z<1) gradient composition oxide superconductor in which w continuously decreases in a direction from the substrate to the gate electrode, or $Y_1Ba_2Cu_{3-v}Co_vO_{7-u}$ (0<v<0.5, 0<u<1) gradient composition oxide superconductor in which v continuously decreases in a direction from the substrate to the gate electrode.

2. A superconducting device as claimed in claim 1, wherein the superconducting channel has a thickness of 10 to 30 nanometers.

3. A superconducting device as claimed in claim 1, wherein the superconducting device further comprises a buffer layer of non-superconducting oxide having a similar crystal structure to that of the oxide superconductor of the superconducting channel between the superconducting channel and the principal surface of the substrate.

4. A superconducting device as claimed in claim 3, wherein the buffer layer is formed of a $Pr_1Ba_2Cu_3O_{7-y}$ film.

5. A superconducting device 3 claimed in claim 1, wherein the superconducting source region and superconducting drain region comprise copper-oxide compound oxide superconductor.

6. A superconducting device as claimed in claim 5, wherein the oxide superconductor is formed of oxide superconductor material selected from the group consisting of a Y—Ba—Cu—O compound oxide superconductor material, a Bi—Sr—Ca—Cu—O compound oxide superconductor material, and a Tl—Ba—Ca—Cu—O compound oxide superconductor material.

7. A superconducting device as claimed in claim 1, wherein the substrate is formed of a material selected from the group consisting of a MgO (100) substrate, a $SrTiO_3$ (100) substrate, a YSZ substrate and a semiconductor substrate having a insulating buffet layer on its surface.

* * * * *